US009405762B2

(12) United States Patent
Amit et al.

(10) Patent No.: US 9,405,762 B2
(45) Date of Patent: Aug. 2, 2016

(54) REDUCING DECOMPRESSION LATENCY IN A COMPRESSION STORAGE SYSTEM (71) Applicant: INTERNATIONAL BUSINESS MACHINES CORPORATION, Armonk, NY (US)

(72) Inventors: Jonathan Amit, Omer (IL); Amir Lidor, Binyamina (IL); Sergey Marenkov, Yehud (IL); Rostislav Raikhman, Rishon-leZion (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/564,743

(22) Filed: Dec. 9, 2014

(65) Prior Publication Data

US 2015/0095295 A1    Apr. 2, 2015

Related U.S. Application Data (63) Continuation of application No. 13/523,593, filed on Jun. 14, 2012, now Pat. No. 8,909,608.

(51) Int. Cl.
*G06F 7/02*   (2006.01)
*G06F 17/30*   (2006.01)
*H03M 7/30*   (2006.01)
*H04L 12/911*   (2013.01)
*H04L 29/06*   (2006.01)

(52) U.S. Cl.
CPC .... *G06F 17/30153* (2013.01); *G06F 17/30138* (2013.01); *H03M 7/30* (2013.01); *H03M 7/6023* (2013.01); *H04L 47/70* (2013.01); *H04L 69/04* (2013.01)

(58) Field of Classification Search
CPC ............ G06F 17/30138; G06F 17/30153; G06F 7/76; G06F 17/30; G06F 3/0608
See application file for complete search history.

(56) References Cited

U.S. PATENT DOCUMENTS

| | | | |
|---|---|---|---|
| 6,208,273 B1 | 3/2001 | Dye et al. | |
| 6,879,266 B1* | 4/2005 | Dye | G06F 12/08 341/51 |
| 8,217,813 B2 | 7/2012 | O'Connor | |
| 2001/0054131 A1 | 12/2001 | Alvarez et al. | |
| 2006/0209615 A1 | 9/2006 | Iwatsu | |
| 2009/0154545 A1 | 6/2009 | Fallon et al. | |
| 2009/0282064 A1* | 11/2009 | Raju | G06F 17/30067 |
| 2012/0144146 A1* | 6/2012 | Borkenhagen | G06F 3/0608 711/170 |
| 2013/0290281 A1 | 10/2013 | Yokoi et al. | |

\* cited by examiner

*Primary Examiner* — Bruce Moser
(74) *Attorney, Agent, or Firm* — Griffiths & Seaton PLLC (57) ABSTRACT

In a compression processing storage system, using a pool of compression cores, the compression cores are assigned to process either compression operations, decompression operations, or decompression and compression operations, which are scheduled for processing. A minimal number of the compression cores are allocated for processing the compression operations, thereby increasing compression latency. Upon reaching a throughput limit for the compression operations that causes the minimal number of the plurality of compression cores to reach a busy status, the minimal number of the plurality of compression cores for processing the compression operations is increased.

36 Claims, 7 Drawing Sheets

REDUCING DECOMPRESSION LATENCY IN A COMPRESSION STORAGE SYSTEM

REFERENCE TO RELATED APPLICATIONS

This application is a Continuation of U.S. patent application Ser. No. 13/523,593, filed on Jun. 14, 2012, the contents of which are incorporated herein by reference.

BACKGROUND OF THE INVENTION

1. Field of the Invention

The present invention relates in general to computers, and more particularly to reducing decompression latency in a compression storage system.

2. Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components. However, due to the various processing components and applications, the computer systems experience input/output (I/O) latencies.

SUMMARY OF THE DESCRIBED EMBODIMENTS

With increasing demand for faster, more powerful and more efficient ways to store information, optimization of storage technologies is becoming a key challenge. Data compression techniques are used to reduce the amount of data to be stored and/or transmitted in order to reduce the storage capacity and/or transmission time respectively. Compression may be achieved by using different compression algorithms known in the art, for example, by sequential data compression, which takes a stream of data as an input and generates a usually shorter stream of output from which the original data can be restored. However, reducing the amount of data to be stored and/or transmitted in order to reduce the storage capacity and/or transmission time respectively increases the compression and decompression latency within a storage system. In any storage system, the compression latency and decompression latency is critical for application performance. For example, compression storage systems introduce processing on a compression and decompression path, which processing overhead causes latency. Currently, there are no techniques available to avoid the decompression latency on unpredicted, random decompression operations. As a result, efficiency and productivity may be reduced. Thus, a solution is required for reducing the decompression latency in a processing storage system is required.

Accordingly, and in view of the foregoing, various exemplary method, system, and computer program product embodiments for reducing decompression latency in a compression processing storage system using a pool of a plurality of compression cores are provided. In one embodiment, by way of example only, the compression cores are assigned to process compression operations, decompression operations, and decompression and compression operations, which are scheduled for processing. A minimal number of the compression cores are allocated for processing the compression operations, thereby increasing compression latency. Upon reaching a throughput limit for the compression operations that causes the minimal number of the plurality of compression cores to reach a busy status, the minimal number of the plurality of compression cores for processing the compression operations is increased.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

As previously mentioned, with increasing demand for faster, more powerful and more efficient ways to store information, optimization of storage technologies is becoming a key challenge. Thus, to avoid and/or dramatically lower the decompression latency (e.g., read operations) on unpredicted, random decompression operations, the present invention seeks to provide as new scheduling operation for decompression and compression operations. In one embodiment, the same pool of compression cores is used for both a compression operation and a decompression operation in the storage system. It should be noted that rather than using general compression cores, a more specific, dedicated hardware component for handling compression and decompression may be used, such as hardware offload engine (e.g., compression cores). In one embodiment, a scheduler is queuing requests (e.g., requests for a decompression and compression) as they arrive for processing in the pool of compression cores. If the request is a compression operation, the scheduler queues a compression request. If the request is a decompression operation, the scheduler queues a decompression request. However, rather than scheduling the requests in a traditional way, such as using a round robin technique or by scheduling based on priority, the scheduling of the I/O request applies a different technique for automatically minimizing the latency for decompression operations (which latency is visible to a user), while increasing the compression latency, since the compression cache (which hides the latency from the user) is able to absorb the increased latency without a user detecting the increased compression latency.

It should be noted that compression operations may be at least ten times longer in the processing time of compression operations as compared to decompression operations. One reason for this significant delay is that in compression operations a search operation is performed for petitions (e.g., looking for data that repeats itself) as compared to decompression operations, which is just decoding the data that was previously searched. So compression may operate in two phases; searching and encoding. Decompression may operate in only one phase; in a decoding phase. Thus, if both the decompression and compression requests are being executed on the same queue (e.g., mixed), efficiency and productivity is reduced, even if queuing by priority is used in the mixed request queue.

Also, the reduction in decompression latency is not reducing the decompression latency of a single decompression request, but reducing the total, overall decompression latency for all of the decompression requests within the queue. For example, if there are 10 requests in a queue and each single request has either a 1 millisecond latency queue or a 2 millisecond latency delay (depending on the type of request), the total, combined latency of all of the requests within the queue is either 10 milliseconds, at a minimum, or 20 milliseconds at a maximum. Also, the last request is receiving all of the previous requests latency due to the delay in the queue. When the requests are unpredicted, random requests, there is currently no method for controlling and reducing the total, combined latency of all of the requests within the queue to the smallest possible value. Because the compression latency is greater than the decompression latency, the illustrated embodiments described herein, provide for the reduction in the decompression latency of all of the decompression requests for unpredicted, random requests, by assigning the compression cores process either compression operations, decompression operations, and/or decompression and compression operations. A maximum number of the compression cores are set for processing only the decompression operations, thereby lowering a decompression latency. A minimal number of the compression cores are allocated for processing the compression operations, thereby increasing compression latency. Upon reaching a throughput limit for the compression operations that causes the minimal number of the plurality of compression cores to reach a busy status, the minimal number of the plurality of compression cores for processing the compression operations is increased.

The scheduling may be for compression processing in a storage system. Since the compression cache is effective in hiding the latency (e.g., compression latency and/or decompression latency) from the user, while the read cache is inefficient for hiding the latency, the scheduling for the decompression operations and the compression operations (e.g., the compression and decompression) is performed so as to lower the decompression latency (e.g., decompression latency) that is visible to the user, while increasing the compression latency (e.g., compression latency) which is hidden.

The new scheduling operation, schedules I/O requests by allocating to each compression core in a pool of compression cores, either a compression request, a decompression request, or a decompression and a compression request. A maximum number of compression cores are set and defaulted for processing only the decompression requests. A minimal amount of compression cores are allocated for processing only the compression requests. The compression operation bandwidth is sustained by measuring core idle times and thresholds enforcement. The threshold may be some predetermined set of criteria to determine if a compression core is idle or busy. For example, one set of criteria could be the throughput limit available on the compression core for processing the compression operations before the compression cache can no longer sustain without detection the increased, but hidden, write latency. The criteria may also be the declaring a compression core busy when 100% of the processing power has been consumed, thus anything less than 100% processing power consumption would be in an idle state. Moreover, a compression core may be considered to be in the idle state when the compression core has not processed any decompression/compression request during specified threshold time period. A compression core may also be considered to be in the busy state when the compression core has processed at least one decompression/compression during a specified threshold time period. The threshold is used to change the compression cores from one state to another state (e.g., from an idle state to a busy state). Each of these factors may be used independent of each other or may be combined to establish the threshold for determining either a busy state or an idles state of the compression cores. On fully loaded systems (e.g., all compression cores are in a busy state), where all compression cores have reached a busy status, all processing cores are assigned to perform both the decompression and compression processing tasks. Moreover, when scheduling the compression/decompression requests between compression cores that have different processing power, a threaded weight value (TWV) is assigned to each one of the compression cores. The TWV allows for the scheduler to assign the compression and decompressions operations according to the TWV assigned to each one of the compression cores. In this way, the compression cores are able to not only receive permission to process only a specific type of operation (e.g., receive permission to only process decompression operations), but also, the TWV allows for each compression core to proportionally process the requests according to processing power of the compression core.

To illustrate the scheduling, consider the following scenario with a pool of four (4) compression cores being used for both a compression operation (e.g., compression operation) and a decompression operation. First, rather than assigning each one of the compression cores both decompression and compression operations, the scheduler assigns "decompression only requests" to the first three compression cores for processing, and assigns "compression only requests" to a single compression core (in this case the right most compression core). Inherently, the compression operations (e.g., the compression operations) consume a significantly greater amount of processing time as compared to decompression operations, which consume a lesser amount of processing time. Thus, by restricting all of the compression operations to only one specific compression core (e.g., the rightmost compression core), and allowing all other compression cores to process only the decompression operations, the latency of the compression operations is increased. This is because there is a larger queue of compression operations, which increases the compression latency, but actually reduces the latency on the decompression operations in the other compression cores. In other words, because there is no mix of decompression operations and compression operations to the compression cores, the scheduling queue for the decompression operations is decreased, thereby lowering the decompression latency, and the scheduling queue for the compression operations is increased, thereby increasing the compression latency. However, the since the compression operations utilize a compression cache, the increase in compression latency is absorbed in the compression cache and remains hidden from the user until the compression cache can no longer sustain without detection, the increased, but hidden, compression latency. The compression operation bandwidth is sustained by measuring core idle times and the threshold enforcement, available on the compression core for processing the compression operations.

In the event that throughput of the compression operations has increased to such a degree that the singular compression core (e.g., the rightmost compression core) goes to one hundred percent utilization, and is no longer capable of handling the throughput of all of the compression operations, an additional compression core may be allocated to handle the compression only tasks. Thus, by now having two compression cores process the compression only operations, the throughput of the compression operations is maintained. Again, because the compression cache hides the latency of the compression operations, the only concern relating to the compression operations is maintaining the throughput of the compression operations. If the throughout becomes significantly large, the compression cache may reach a point where the compression latency is no longer absorbed by the compression cache. By maintaining the throughput, despite the increased latency of the compression operations, the compression cache continually absorbs all of the compression latency of the compression operations, thereby allowing the latency of the compression operations to remain irrelevant and hidden to the user. The compression cache may be compared to springs on a vehicle and the throughput compared to the height of a bump in the road. If the height of the bump (throughput) in the road is low, the springs (compression cache) will absorb all, if not most, of the disturbance (compression latency). If the height of the bump (throughput) in the road is high, the springs (compression cache) may not absorb the entire disturbance (compression latency) created by a bump and a person (user) will feel the disturbance (compression latency).

The remaining two compression cores continue to process the decompression only operations. The other two compression cores only process the compression only operations. Again, by restricting all compression operations to two specific compression cores (e.g., the two rightmost compression cores) and allocating the other two compression cores to process only the decompression operations (e.g., the decompression operations), the latency of the compression operations is still increased because there remains a larger queue of compression operations. However, the decompression latency on the decompression operations in the two other compression cores is still reduced. The restriction of not mixing the decompression and compression operations to any of the compression cores is maintained.

The process of adding an additional compression core for handling the compression operations may continue for an nth number of times, depending on how many compression cores are in the pool of compression core resources, if the throughput of the compression operations has increased to such a degree that both of the two compression cores (e.g., the rightmost compression core) go to one hundred percent utilization (e.g., reach a busy state) and are both no longer capable of handling the throughput of all of the compression operations. If the situations arises where all compression cores are fully loaded and are at one hundred percent utilization, the scheduler may now mix the decompression and compression operations and assign both decompression and compression operations to all of the compression cores.

It should noted the illustrated embodiments described herein, may be applied and used in the compression operations performing any compression of data that is being compressed to a disk/storage system and/or or any decompression/manipulation to data that is being decompressed from a disk/storage system, and this manipulation is requiring processing power.

Figure 1:
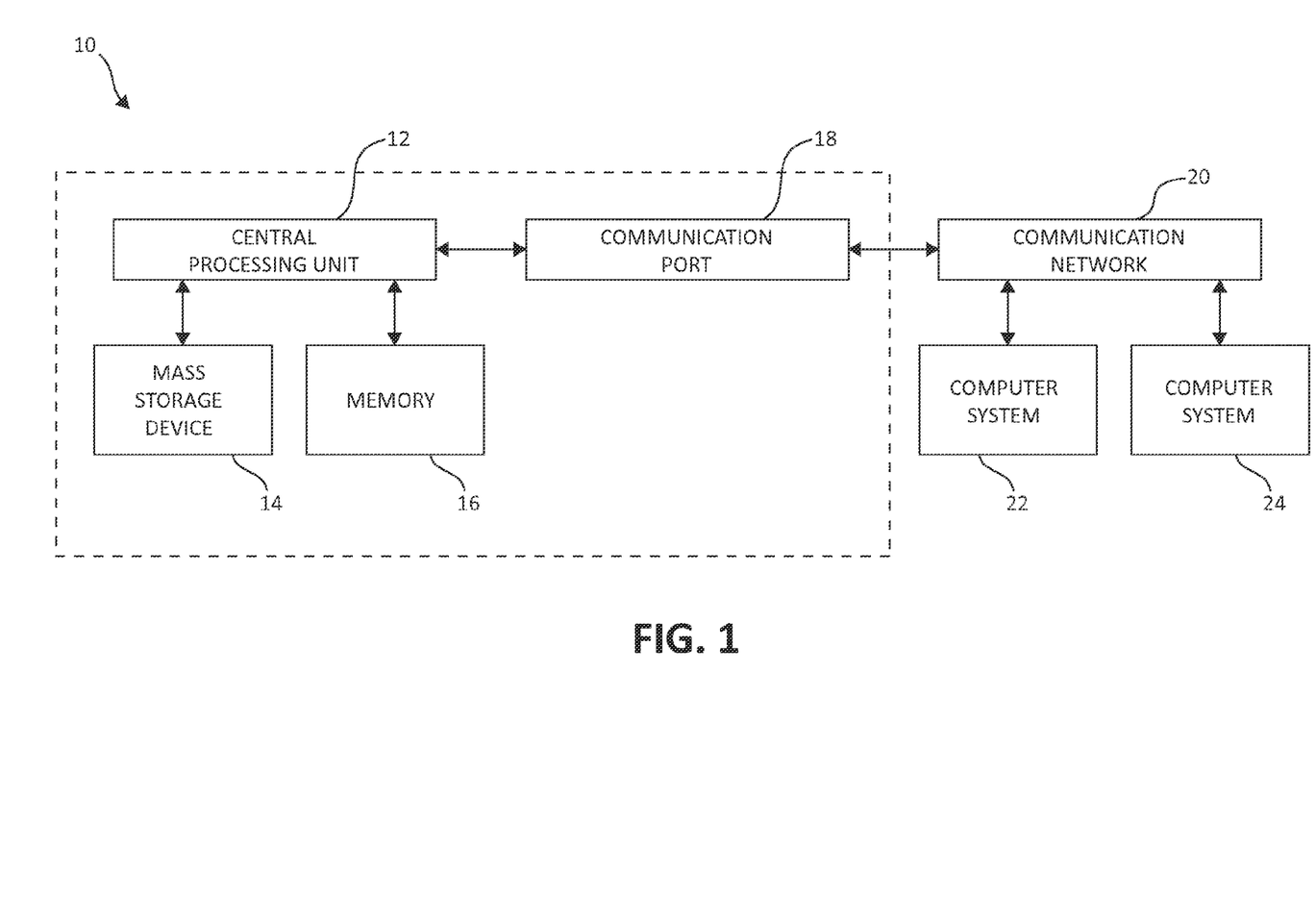
FIG. 1 is a block diagram illustrating a computing system environment having an example storage device in which aspects of the present invention may be realized.

Turning now to FIG. 1, exemplary architecture 10 of data storage systems (e.g., virtual tape systems) in a computing environment is depicted. The computer system 10 includes central processing unit (CPU) 12, which is connected to mass storage device(s) 14 and memory device 16. Mass storage devices can include hard disk drive (HDD) devices, solid-state devices (SSD) etc, which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
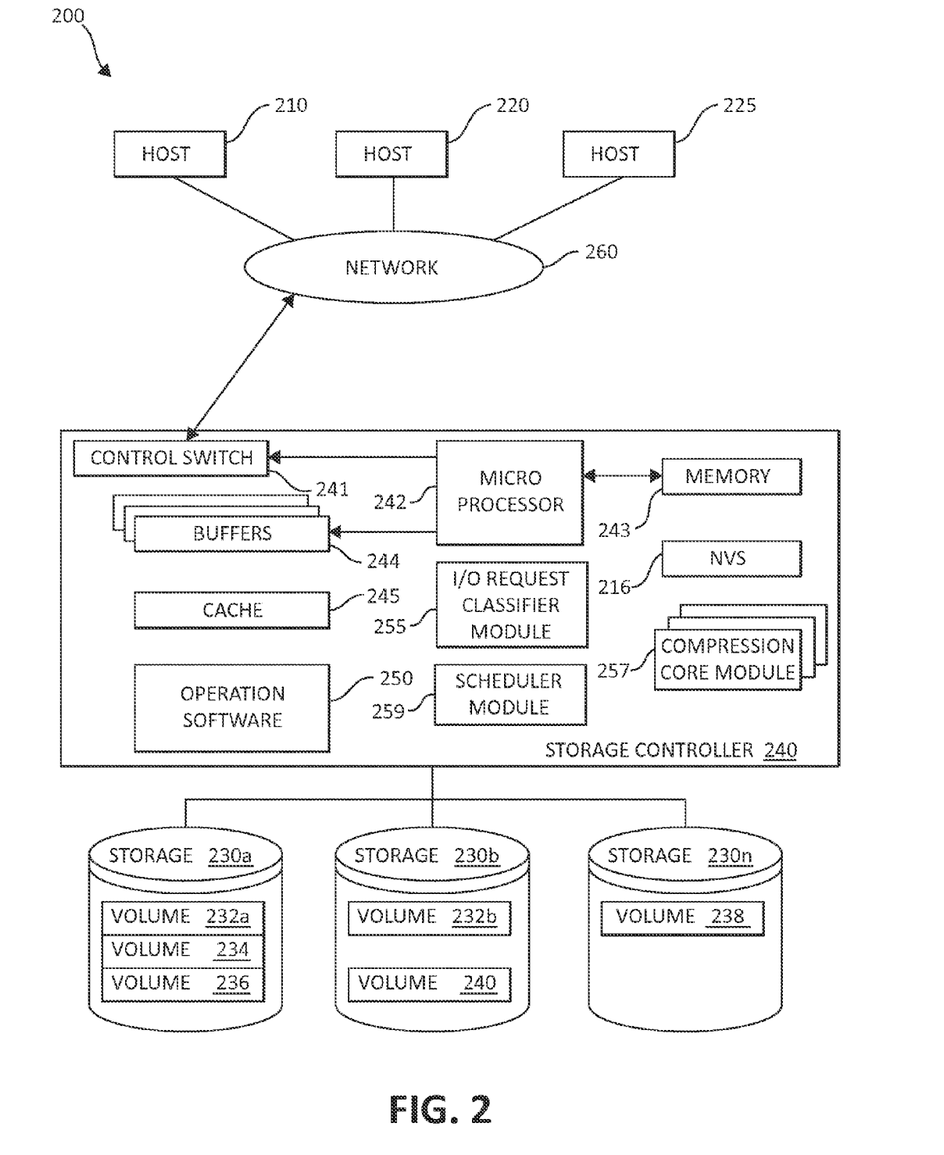
FIG. 2 is a block diagram illustrating a hardware structure of an exemplary data storage system in a computer system in which aspects of the present invention may be realized.

FIG. 2 is an exemplary block diagram 200 showing a hardware structure of a data storage system in a computer system according to the present invention. Referring to FIG. 2, there are shown host computers 210, 220, 225, each acting as a central processing unit for performing data processing a part of a data storage system 200. The hosts (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 1 comprising storage controller 240 and storage 230.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Storage 230 may be comprised of one or more storage devices, such as storage arrays, which are connected to storage controller 240 by a storage network.

In some embodiments, the devices included in storage 230 may be connected in a loop architecture. Storage controller 240 manages storage 230 and facilitates the processing of compression and decompression requests intended for storage 230. The system memory 243 of storage controller 240 stores program instructions and data, which the processor 242 may access for executing functions and method steps associated with managing storage 230 and executing the steps and methods of the present invention in a computing environment. In one embodiment, system memory 243 includes, is associated, or is in communication with the operation software 250 in a computer storage environment, including the methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the Cache 245 for any purposes suited to accomplish the objectives of the present invention. In some embodiments, a backup power source (not shown in FIG. 2), such a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a I/O request classifier module 255, a compression core(s) module 257, and a scheduler module 259 in a computing environment. The I/O request classifier module 255, compression core(s) module 257, and the scheduler module 259 may work in conjunction with each and every component of the storage controller 240, the hosts 210, 220, 225, and storage devices 230. The I/O request classifier module 255, compression core(s) module 257, and the scheduler module 259 may be structurally one complete module or may be associated and/or included with other individual modules. The I/O request classifier module 255, compression core(s) module 257, and the scheduler module 259 may also be located in the cache 245 or other components of the storage controller 240 to accomplish the purposes of the present invention.

The storage controller 240 may be constructed with a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control and each table described later, cache 245 for temporarily storing (buffering) data, and buffers 244 for assisting the cache 245 to read and write data, a control switch 241 for controlling a protocol to control data transfer to or from the storage devices 230, the I/O request classifier module 255, compression core(s) module 257, and the scheduler module 259 on which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network adaptor (this could be a fibre channel) 260 as an interface i.e., via at least one switch called "fabric." In one embodiment, by way of example only, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, the I/O request classifier module 255, compression core(s) module 257, and the scheduler module 259 are in communication with each other and may be separate or one individual component(s). Also, several, if not all of the components, such as the operation software 250 may be included with the memory 243. Each of the components within the devices shown may be linked together and may be in communication with each other for purposes suited to the present invention.

As mentioned previous, in one embodiment, by way of example only, the compression cores are assigned to process compression operations, decompression operations, or decompression and compression operations, which are scheduled for processing. A maximum number of the compression cores are set for processing only the decompression operations, thereby lowering decompression latency. A minimal number of the compression cores are allocated for processing the compression operations, thereby increasing compression latency. Upon reaching a throughput limit for the compression operations that causes the minimal number of the plurality of compression cores to reach a busy status, the minimal number of the plurality of compression cores for processing the compression operations is increased.

In this way, the decompression latency is reduced in a processing storage system with a compression cache, using a pool of processor cores used for both decompression and compression operations. The decompression requests are scheduled for lowering the decompression latency, which are visible to the user, while increasing the compression latency that is hidden using the compression cache. As will be illustrated below in FIG. 3, the illustrated embodiments first define a state of the compression cores. The compression cores may be either defined to be in an idle state or a busy state. As mentioned previous, a compression core may be considered to be in the idle state when the compression core has not processed any input/output (I/O) request (e.g., a task for compression or decompression) during a last, specified threshold time period. A compression core may be considered to be in the busy state when the compression core has processed at least one I/O request/task (e.g., for compression or decompression) during a last, specified threshold time period.

For compression cores with different processing power, a thread weight value (TWV) may be assigned. The TWV determines what proportion of the workload the compression core will bear relative to other compression cores. For example, if one compression core has TWV weight of 30 and all other threads have TWV weight of 60, the 30-weight thread will bear half as much as any other thread that has the 60-weight thread.

Each I/O request (e.g., compression/decompression operation) will be assigned to one compression core from a pool of compression cores. These I/O requests/tasks that are to be sent to the compression cores are classified as either a decompression operation or a compression operation. Since the compression cores are given a status of either idle or busy, the compression cores are granted permission to handle the decompression operations and/or compression operations, depending on the determined status (idle or busy). The decompression and compression operations are further classified as one of at least three concrete types of operations: decompression only operations (D), compression only operations (C) and/or decompression and compression operations (D/C).

The default assignment of the I/O requests/tasks is to set a maximum number of compression cores for the decompression operations and to allot only a minimum number of compression cores the compression operations. To sustain the compression operations' I/O bandwidth, the compression core idle time and threshold enforcement (e.g., the throughput limit) are measured, and additional compression cores for the I/O request for the compression operations may be allocated as needed. On a fully loaded system, all compression cores may be assigned to decompression and compression operations.

For example, consider a system with pool of four compression cores (cores #1, #2, #3, and #4) and the processing power of compression core #1 is half as compared with all the other compression cores. The default assignment (when all cores are IDLE) is to assign the maximum number of cores to the decompression operations and minimal number of cores to the compression operations. Since compression core #1 has half as much processing powers as all other cores, the number of I/O requests scheduled for compression core #1 to process will be less. The scheduled number of I/O requests for compression core #1 will be assigned according to the TWV. When the compression operations' I/O bandwidth is increasing, the compression core #4 will become busy at the point of reaching the TWV. At this point, an additional core, which would be core #3 since it is the core that is adjacent to core #4, is assigned to perform the write I/O requests. Again, because core #1 has half as much processing powers as all other cores, the number of I/O requests scheduled for compression core #1 to process will be less. The scheduled number of decompression requests for compression core #1 will be assigned according to the TWV. When the compression operations' bandwidth for core #3 is increasing, the compression core #3 will become busy at the point of reaching the TWV. At this point, an additional core, which would be compression core #2 since it is the core that is adjacent to compression core #3, is assigned to perform the compression I/O requests. Again, because core #1 has half as much processing powers as all other cores, the number of I/O requests scheduled for compression core #1 to process will be less. The scheduled number of I/O requests for compression core #1 will be assigned according to the TWV. In a fully loaded system (e.g., all the core are busy), all compression cores are assigned to process the decompression and compression I/O requests. Similar to the previous stated scenarios, even when all compression cores are busy, compression core #1 has half as much processing powers as all other compression cores, the number of I/O requests scheduled for compression core #1 to process will be less. The scheduled number of I/O requests for compression core #1 will be assigned according to the TWV.

Figure 3:
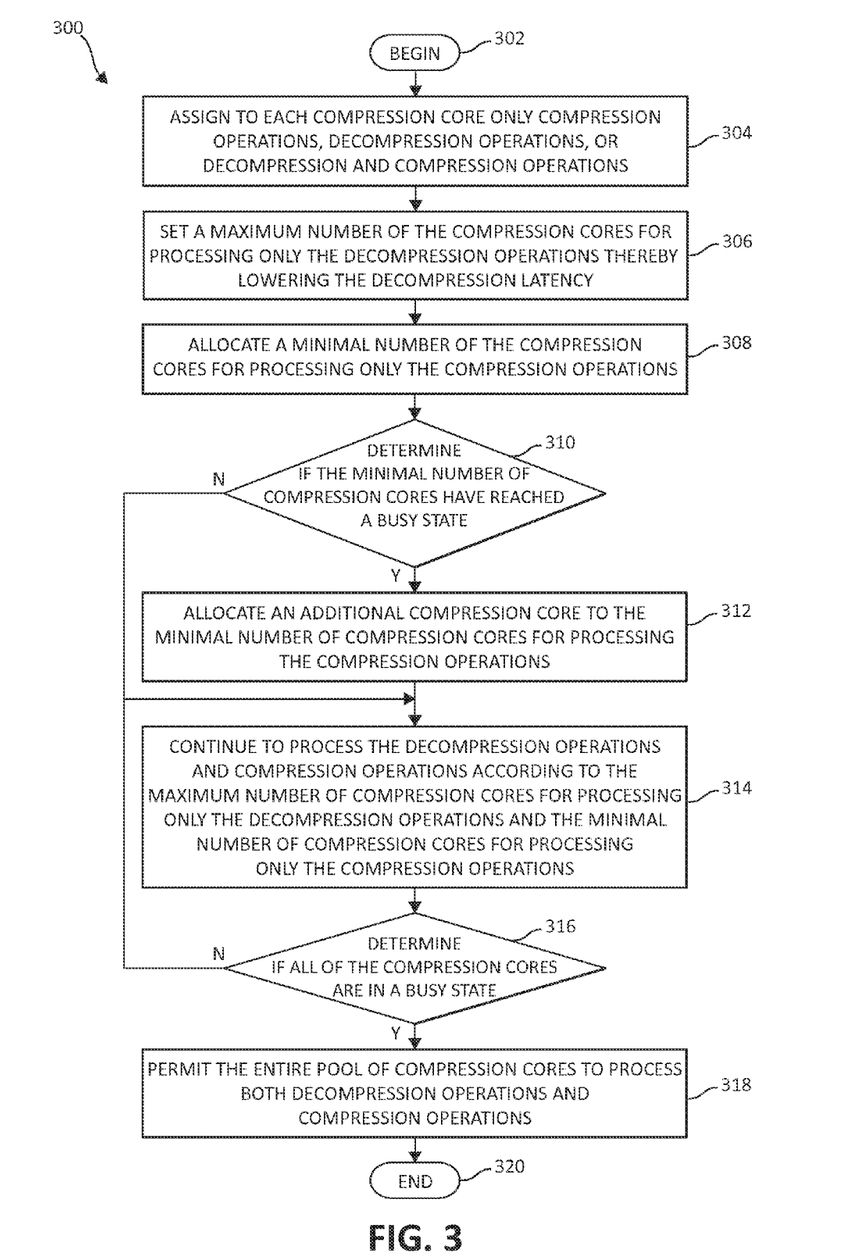
FIG. 3 is a flowchart illustrating an exemplary method for reducing decompression latency in a compression storage system.

Turning now to FIG. 3, a flowchart illustrating an exemplary method 300 for reducing decompression latency in a compression storage system is depicted. The method 300 begins (step 302) by assigning to each compression core only compression operations, decompression operations, or decompression and compression operations (step 304). A TWV may be set/assigned for the compression cores having different processing power (e.g., the compression cores with different processing power are assigned the TWV weight value) to assist with allocating the decompression operations and the compression operations, for which the compression cores have been granted access to perform, to proportionately process the decompression operations and the compression operations according to the TWV. A maximum number of the compression cores are set for processing only the decompression operations, thereby lowering the decompression latency (step 306). A minimal number of the compression cores are allocated for processing only the compression operations (step 308). This minimal number of the compression cores may be just one compression core that is allocated for processing the compression operations. The method 300 determines if, the minimal number of compression cores have reached a busy status (step 310). If yes, the method 300 may allocate an additional compression core to the minimal number of compression cores for processing the compression operations (step 312). If no, the method 300 continues to process the decompression operations and compression operations according to steps 306 and 308 (step 314). The method 300 also determines if all of the compression cores are in a busy state (step 316). In other words, if there is only one remaining core in the "maximum set number of compression cores" for processing the decompression only operations has achieved 100% utilization or reached the TWV threshold, then this last remaining compression core will become busy. If all of the compression cores are in a busy status/state, the method 300 permits the entire pool of processing cores to process both decompression operations and compressions operations (step 318). If all of the compression cores are not in a busy status, the method 300 continues to process the decompression operations and compression operations according to steps 306 and 308. The method ends (step 320). It should be noted that a time out period may and set for determining if the compression cores are in an idle state or a busy state.

As mentioned previously, the decompression and compression operations are further classified as one of at least three concrete types of operations: decompression only operation (D), compression only operation (C) and/or decompression and compression operation (D/C). The permissions for the decompression only operation (D), the compression only operation (C) and/or the decompression and compression operation (D/C) are granted to each compression core and illustrated below in FIGS. 4-7.

Figure 4:
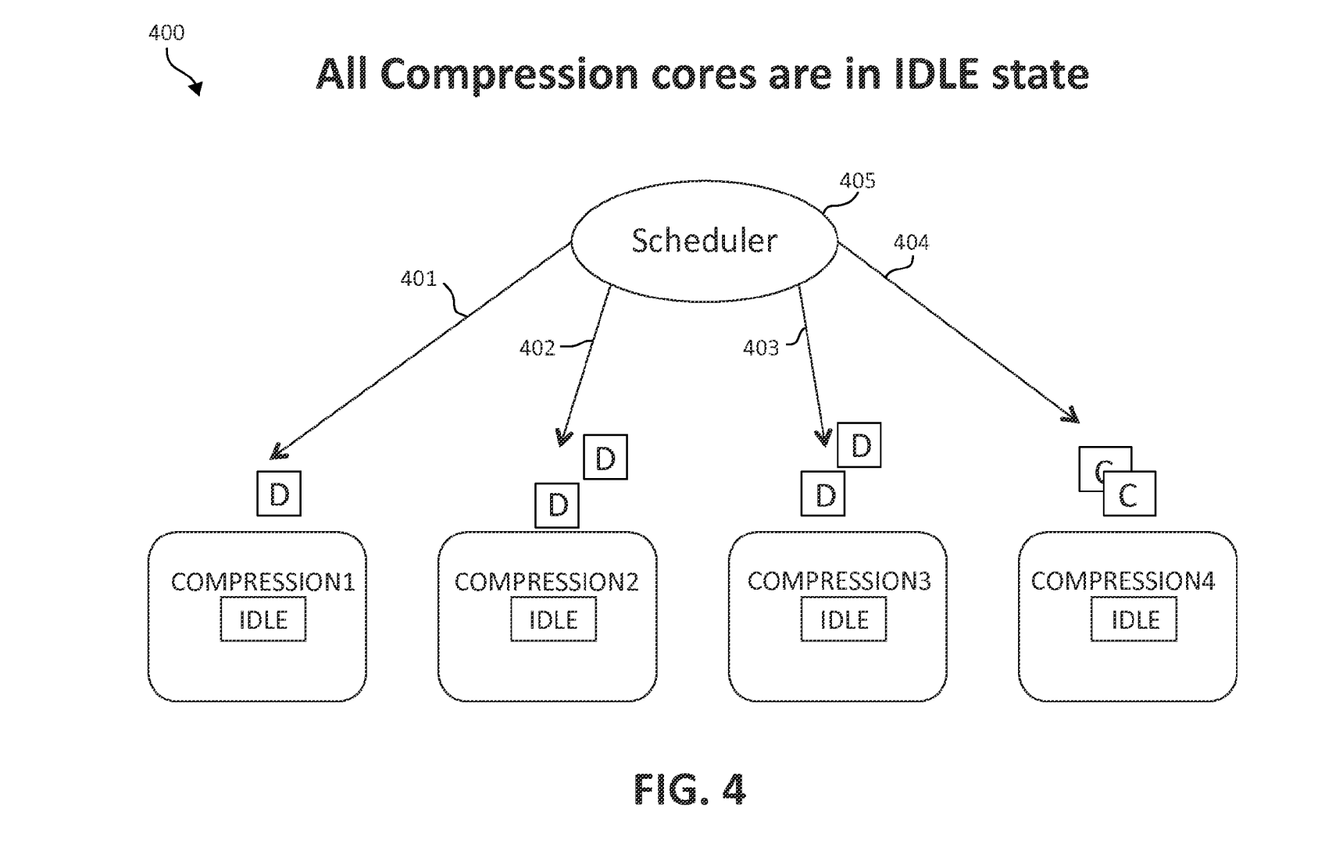
FIG. 4 is a block diagram illustrating exemplary operations for reducing decompression latency where all compression cores are in an idle state.

FIG. 4 is a block diagram 400 illustrating exemplary operations for reducing decompression latency where all compression cores are in an idle state. When all compression cores (labeled as compression core 1, compression core 2, compression core 3, and compression core 4) are determined to be in an idle state, all threads (e.g., all compression cores) except the last compression core 4 (counted from left to right) will be assigned/permitted to processes only decompression operations (D) (labeled in FIGS. 4-7 as "D"), and the last thread (e.g., the last compression core 4) will be permitted to process only compression operations (C) (labeled in FIGS. 4-7 as "C"). In this scenario, each of the compression cores (e.g., compression cores 1-3), expect for the last compression core (e.g., compression core 4), are assigned/granted permission 401, 402, and 403 to process only decompression operations (D). Thus, three compression cores 1-3 are determined to be the maximum number of cores to process the decompression operations (D) and the minimum number of compression cores for processing the compression operations (C) is determined to be one. For setting and determining the maximum number of compress cores for processing the decompression operations (D), in one embodiment, the compression cores are counted, starting from a firstmost position (e.g., a leftmost position) and continuing the counting until just previous to a lastmost position (e.g., stop counting just previous to the rightmost positioned compression core). In other words, all compression cores, starting from the left and counting to the right, and stopping just short of the last, rightmost positioned core, may be determined to be set as the maximum number of the compression cores for being assigned the decompression operations (D). The lastmost (e.g., the rightmost positioned core is then considered to be the minimum number of cores for being assigned the compression operations (C).

Thus, the scheduler 405 assigns/sends 401, 402, and 403 each compression core (e.g., compression core 1-3), expect for the last compression core (e.g., compression core 4), the decompression only operations (D). The last compression core (e.g., compression core 4) is assigned/granted permission 404 to process compression only operations (C). More specifically, the scheduler sends to the last compression core (e.g., compression core 4) only the compression only operations (C).

Moreover, if each compression core is assigned a thread weight value (TWV), and the TWV determines what proportion of the workload the compression core will bear relative to other compression cores, each compression core will proportionally process the decompression operations and the compression operations. In this scenario 400, by way of example only, compression core 1 is assigned a lowest TWV, and compression cores 2-4 are assigned a different TWV. Thus, based upon the TWV assigned to compression core 1, the scheduler 405 assigns/sends 401 only 1 decompression only operations (D) to compression core 1. Also, based on the TWV assigned to each of the remaining cores (compression cores 2-4), the scheduler 405 assigns/sends 402 and 403 to compression core 2 and compression core 2 two decompression operations (D), and the scheduler 405 assigns/sends 404 to compression core 4 two compression operations (C).

As a general rule, when a compression core from the lastmost side (e.g., the rightmost side) is determined to be in the busy state, and all other compression cores to the left side of this lastmost compression core (e.g., rightmost compression core) are determined to be in the idle state, at least one additional compression core from this lastmost side (e.g., right side) is granted permission for processing compression operations. In other words, each time a compression core from the right side and reached a busy status, and all other compression cores from left side are in idle state, compression permissions are granted to additional compression cores from the rightmost side. (This additional compression core, which was determined to be in the idle state, may now receive permission for the compression operations. This additional compression core is to the immediate left of the right most compression unit that was determined to be in the busy mode. This process, as mentioned previously and illustrated below in FIGS. 5-6, assists in determining and setting the maximum number of cores for assigning the decompression operations and the minimal number of cores for the compression operations.

Figure 5:
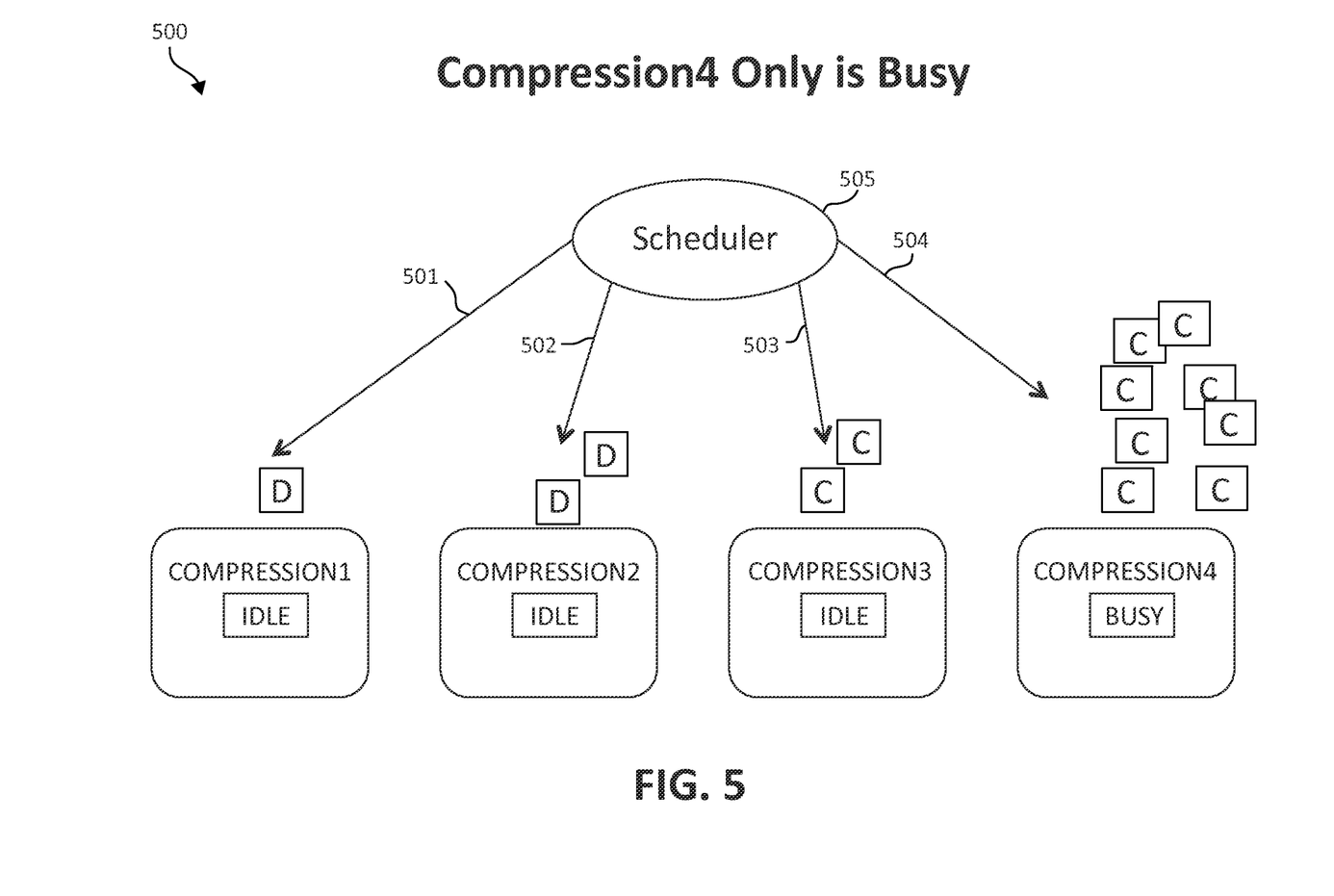
FIG. 5 is a block diagram illustrating exemplary operations for reducing decompression latency where all compression cores are in an idle state except for a rightmost compression core.

FIG. 5 is a block diagram 500 illustrating exemplary operations for reducing decompression latency where all compression cores are in an idle state except for a rightmost compression core. In this scenario all compression cores 1-3 are determined to be in an idle state except for a rightmost compression core 4, which is determined to be in the busy state. Thus, by applying the general rule, as mentioned above the first two threads (e.g., compression cores 1 and 2) will be permitted to process only the decompression only operations (D). More specifically, the scheduler 505 assigns/sends 501 and 502 to compression cores 1 and 2 only the decompression only operations (D).

Since the lastmost compression core 4 is determined to be in a busy status, and all other compression cores 1-3, that were to the left side of this lastmost compression core 4 are in an idle status, an additional compression core (e.g., compression core 3), that is just left of this lastmost side (e.g., compression core 3 is just left of compression core 4), is now assigned/granted 503 permission for processing compression operations (C). More specifically, the scheduler 505 sends 503 to this additional compression core (e.g., compression core 3) that is just left of this lastmost side of compression cores (e.g., compression core 4), only the compression only operations (C).

As stated above, if each core is assigned a thread weight value (TWV), and the TWV determines what proportion of the workload the compression core will bear relative to other compression cores, each compression core will proportionally process the decompression operations and the compression operations. In this scenario 500, by way of example only, compression core 1 is assigned a lowest TWV, and compression cores 2-4 are assigned a different TWV. Thus, based upon the TWV assigned to compression core 1, the scheduler 505 assigns/sends 501 only 1 decompression only operations (D) to compression core 1. Also, based on the TWV assigned to compression cores 2-4, the scheduler 505 assigns/sends 503 two decompression only operations (D) to compression core 2. However, compression core 4 is in a busy status, when processing 8 compression only operations (C) because the compression operations' I/O bandwidth was increasing for each additional compression only operation (C). At this point, compression core 4 had a busy status, due to the throughput limit reaching a maximum allowable point before the compression cache could no longer sustain, without detection, the increased, but hidden, compression latency. Because of the busy status, an additional core, which would be compression core 3 since it is the compression core that is adjacent to compression core 4, is assigned 503 to process only the compression I/O requests (C). Thus, the scheduler 505 sends 503 two compression only operations (C) to compression core 3.

Figure 6:
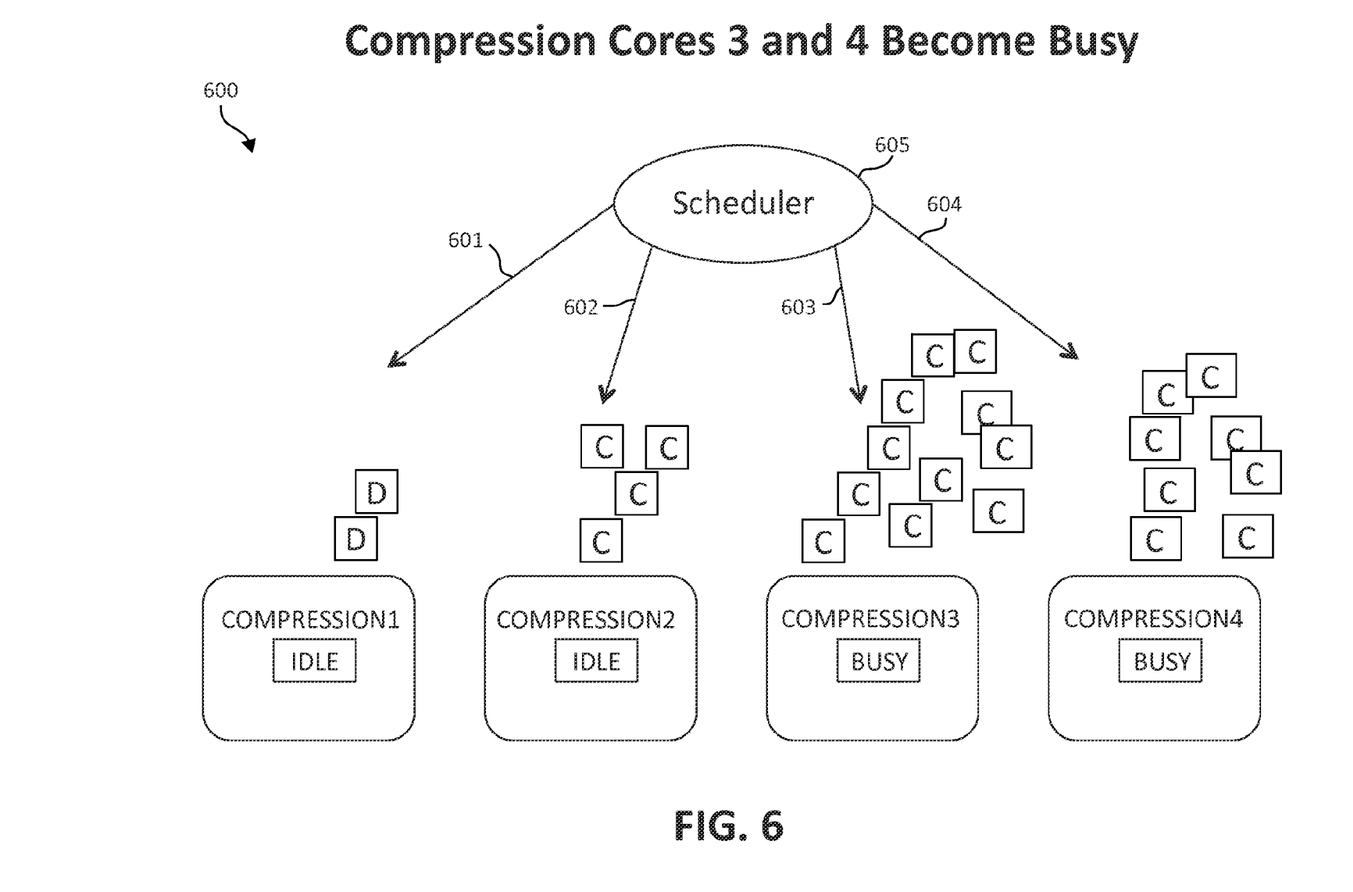
FIG. 6 is a block diagram illustrating exemplary operations for reducing decompression latency where all compression cores are in an idle state except for the 2 rightmost compression cores.

FIG. 6 is a block diagram 600 illustrating exemplary operations for reducing decompression latency where all compression cores are in an idle state except for the 2 rightmost compression cores. In this scenario compression cores 1-2 are determined to be in an idle state. The two-lastmost/rightmost compression cores 3-4 are determined to be in the busy state. Thus, by applying the general rule, as mentioned above, only the first thread (e.g., compression core 1) will be assigned/permitted 601 to process only the decompression only operations (D). More specifically, the scheduler 605 only sends 601 to the first compression cores (e.g., compression core 1) the decompression only operations (D).

Since the two, lastmost compression cores 3-4 were determined to be busy, an additional compression core (e.g., compression core 2) that is just left of the first one of the lastmost compression cores (e.g., compression core 3) is now assigned/granted 602 permission for processing compression only operations (C). More specifically, the scheduler sends to this additional compression core (e.g., compression core 2) that is just left of the first one of the lastmost side of compression cores (e.g., compression core 3), only compression operations (C), even though this additional compression core (e.g., compression core 2) was determined to be in the idle state. The scheduler 605 sends 603 and 604 to these two lastmost-compression cores (e.g., compression cores 3 and 4) only the compression only operations (C).

Similar to FIG. 5 and FIG. 6, if each compression core has a different processing power, a thread weight value (TWV) is assigned, and the TWV determines what proportion of the workload the compression core will bear relative to other compression cores. Each compression core will proportionally process the decompression operations and the compression operations, according to the TWV. In this scenario 500, by way of example only, compression core 1 is assigned a lowest TWV, and compression cores 2-4 are assigned a different TWV. Thus, based upon the TWV assigned to compression core 1, the scheduler 605 assigns/sends 601 two decompression only operations (D) to compression core 1. The scheduler 605 sends 602 three compression only operations (C) to compression core 2. As illustrated, compression core 3 sends 603 ten compression only operations (C). Compression core 4 sends 604 eight compression only operations (C). This was because the compression operations' I/O bandwidth was increasing for compression cores 3 and 4 and both compression cores 3-4 reached a busy status, and thus, reached a threshold limit, where the compression cache could no longer sustain without detection, the increased, but hidden, compression latency. Thus compression core 3 was allocated to the minimal number of compression cores for handing the additional compression only operations (C). Thus, the scheduler 605 sends 603 three compression only operations (C) to compression core 2. Compression cores 3 and 4 continue to process the assigned/sent 603 and 604 compression only operations (C).

However, when all compression cores 1-4 are determined to be in an busy state, each one of the compression cores are granted permission to process (e.g., handle) both decompression operations and compression operations. This scenario is depicted in FIG. 7 below.

Figure 7:
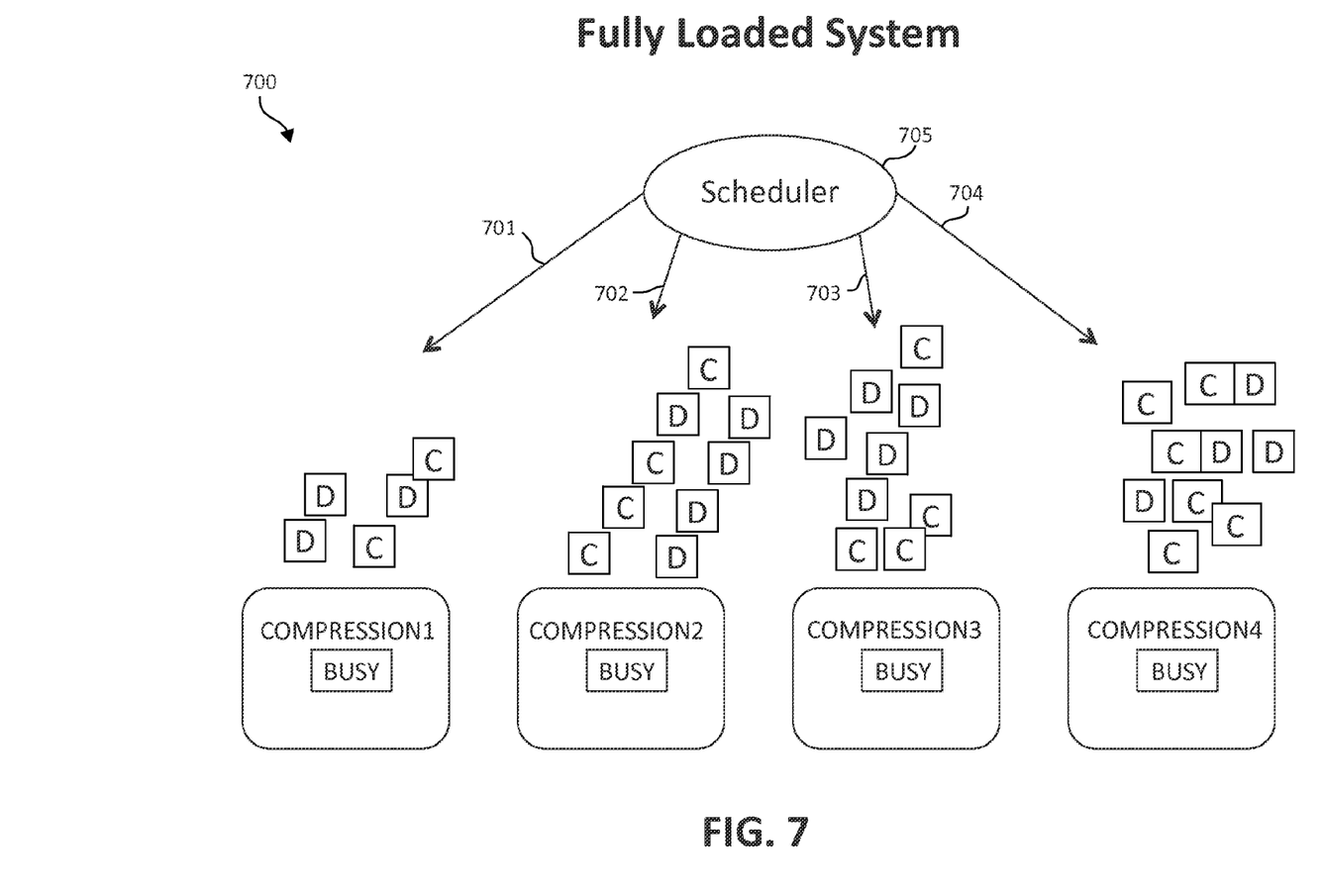
FIG. 7 is a block diagram illustrating exemplary operations for reducing decompression latency where all compression cores are in the busy state.

FIG. 7 is a block diagram 700 illustrating exemplary operations for reducing decompression (I/O) latency where all compression cores are in the busy state. When all compression cores 1-4 are determined to be in the busy state, all threads (e.g., all compression cores 1-4) will be assigned/permitted 701, 702, 703, and 704 to handle both decompression operations and compression operations (labeled in the diagram as "D" and "C" rather than as described above that indicated a "decompression and compression operation (D/C)"). In this scenario, each of the compression cores 1-4 is assigned/permitted 701, 702, 703, and 704 (e.g., granted permission) to process the decompression operations (D) and the compression operations (C). More specifically, the scheduler 705 assigns/sends 701, 702, 703, and 704 to each compression core 1-4 both the decompression only operations (D) and the compression only operations (C).

In the fully loaded system (e.g., all the core are busy), all compression cores are assigned to process the decompression and compression I/O requests. Similar to the previous stated scenarios, even with all of the compression cores reaching a busy status, core #1 has half as much processing powers as all other cores. The number of I/O requests scheduled for core #1 to process will be less because of the difference in processing power. The scheduled number of decompression operation for compression core 1 will be assigned according to the TWV. Similar to FIGS. 5-7, if the compression cores 1-4 have different processing powers, each compression core is assigned a thread weight value (TWV). The TWV determines what proportion of the workload each of the compression cores 1-4 will bear relative to other compression cores. In other words, based upon the TWV, each compression core 1-4 may proportionally process the decompression operations (D) and the compression operations (C) according to the TWV that is reflective of the processing power of the core. In this scenario 700, compression core 1 is assigned a lowest TWV, and compression core 2, compression core 3, and compression core 4 are assigned a TWV that is different than compression core 1. Thus, based upon the TWV assigned to compression core 1, the scheduler 705 only assigns/sends 701 three decompression only operations (D) and two compression only operations (C) to compression core 1. The scheduler 705 sends 702 five decompression only operations (D) and four compression only operations (C) (9 total classified tasks) to compression core 2. The scheduler 705 assigns/sends 703 five decompression only operations (D) and four compression only operations (C) (9 total classified tasks) to compression core 3 and four decompression only operations (D) and six compression only operations (C) (10 total classified tasks) to compression core 4.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for reducing decompression latency in a compression processing storage system using a pool of a plurality of compression cores, comprising:
  assigning to the plurality of compression cores for processing only one of compression operations, decompression operations, and decompression and compression operations that are scheduled for processing; and
  allocating a minimal number of compression cores for processing compression operations, thereby increasing a compression latency, wherein upon reaching a throughput limit for the compression operations that causes the minimal number of compression cores to reach a busy status, the minimal number of compression cores for processing the compression operations is increased.

2. The method of claim 1, further including setting a maximum number of compression cores for processing only decompression operations, thereby lowering the decompression latency.

3. The method of claim 1, further including scheduling the one of compression operations, decompression operations, and decompression and compression operations, between the pool of the plurality of processing cores, according to a thread weight value (TWV) that is assigned to each one of the plurality of processing cores having a difference in processing power.

4. The method of claim 1, further including, if processing compression operations, sustaining a bandwidth of the compression operations by measuring core idle time and a throughput limit.

5. The method of claim 1, further including setting a time-out period for a predetermined threshold period for processing the one of compression operations, decompression operations, and decompression and compression operations.

6. The method of claim 1, further including, if processing compression and decompression operations, assigning the decompression and compression operations to each of the plurality of processing cores for processing if each of the plurality of compression cores have attained the busy status.

7. The method of claim 1, wherein the busy status represents those of the plurality of compression cores that have processed the one of the compression operations, decompression operations, and decompression and compression operations during a predetermined threshold period.

8. The method of claim 1, further including assigning only decompression operations to the plurality of compression cores having an idle status, wherein the idle status represents those of the plurality of compression cores that have yet to process the one of compression operations, decompression operations, and decompression and compression operations during a predetermined threshold period.

9. The method of claim 7, further including:
if processing compression operations, determining whether each one of the plurality of compression cores had one of the idle status and the busy status during a last-predetermined threshold period; and
determining the minimum number of the plurality of compression cores by locating the lastmost positioned one of the plurality of compression cores to process the compression operations.

10. The method of claim 1, further including determining the maximum number of the plurality of compression cores by, from a firstmost positioned one of the plurality of compression cores, sequentially counting, each one of the plurality of compression cores until reaching a lastmost positioned one of the plurality of compression cores, to include in the maximum number of the plurality of compression cores to process decompression operations.

11. The method of claim 9, further including:
if processing compression operations, if the lastmost positioned one of the plurality of compression cores is determined to be in the busy status, and those of the plurality of compression cores to the left of positioned before the lastmost positioned one of the plurality of compression cores are in the idle status:
permitting one of the plurality of compression cores that is positioned immediately before the lastmost positioned one of the plurality of compression to process the compression operations.

12. The method of claim 11, further including:
if processing compression operations, if at least one or more of an nth number of lastmost positioned ones of the plurality of compression cores are determined to be in the busy status, and all other of the plurality of compression cores to the left of the at least one or more of the nth number of lastmost positioned ones of the plurality of compression cores are in the idle status:
permitting an additional one of the at least one or more of the nth number of lastmost positioned ones of the plurality of compression cores to process the compression operations.

13. A system for reducing decompression latency in a compression processing storage system using a pool of a plurality of compression cores, comprising:
at least one scheduler scheduling compression operations, decompression operations, and decompression and compression operations between the pool of the plurality of processing cores,
at least one compression cache, remotely connected to each of the plurality of compression cores, assisting with the compression operations;
at least one processor device, controlling the at least one scheduler and the at least one compression cache, and operable in the compression processing storage system, wherein the at least one processor device:
assigns to the plurality of compression cores for processing only one of compression operations, decompression operations, and decompression and compression operations that are scheduled for processing, and
allocates a minimal number of the plurality of compression cores for processing compression operations, thereby increasing a compression latency, wherein upon reaching a throughput limit for the compression operations that causes the minimal number of compression cores to reach a busy status, the minimal number of compression cores for processing the compression operations is increased.

14. The system of claim 13, wherein the at least one processor device sets a maximum number of compression cores for processing only decompression operations, thereby lowering the decompression latency.

15. The system of claim 13, wherein the at least one processor device assigns a thread weight value (TWV) to each one of the plurality of processing cores having a difference in processing power, wherein the compression operations, decompression operations, and decompression and compression operations, between the pool of the plurality of processing cores, are proportionally scheduled by the scheduler according to the TWV.

16. The system of claim 13, wherein the at least one processor device sustains a bandwidth of the compression operations by measuring core idle time and a throughput limit.

17. The system of claim 13, wherein the at least one processor device sets a time-out period for a predetermined threshold period for processing the compression operations, decompression operations, and decompression and compression operations.

18. The system of claim 13, wherein the at least one processor device assigns the decompression and compression operations to each of the plurality of processing cores for processing if each of the plurality of compression cores have attained the busy status.

19. The method of claim 13, wherein the busy status represents those of the plurality of compression cores that have processed at least one of the compression operations, decompression operations, and decompression and compression operations during a predetermined threshold period.

20. The system of claim 13, wherein the at least one processor device assigns only decompression operations to the plurality of compression cores having an idle status, wherein the idle status represents those of the plurality of compression cores that have yet to process any of the compression operations, decompression operations, and decompression and compression operations during a predetermined threshold period.

21. The system of claim 19, wherein the at least one processor device:
- determines whether each one of the plurality of compression cores had one of the idle status and the busy status during a last-predetermined threshold period; and
- determines the minimum number of the plurality of compression cores by locating the lastmost positioned one of the plurality of compression cores to process the compression operations.

22. The system of claim 13, wherein the at least one processor device determines the maximum number of the plurality of compression cores by, from a firstmost positioned one of the plurality of compression cores, sequentially counting each one of the plurality of compression cores, until reaching a lastmost positioned one of the plurality of compression cores, to include in the maximum number of the plurality of compression cores to process decompression operations.

23. The system of claim 21, wherein the at least one processor device:
- if the lastmost positioned one of the plurality of compression cores is determined to be in the busy status, and those of the plurality of compression cores positioned before the lastmost positioned one of the plurality of compression cores are in the idle status:
  - permits one of the plurality of compression cores that is positioned immediately before the lastmost positioned one of the plurality of compression to process the compression operations.

24. The system of claim 23, wherein the at least one processor device:
- if at least one or more of an nth number of lastmost positioned ones of the plurality of compression cores are determined to be in the busy status, and all other of the plurality of compression cores to the left of the at least one or more of the nth number of lastmost positioned ones of the plurality of compression cores are in the idle status:
  - permits an additional one of the at least one or more of the nth number of lastmost positioned ones of the plurality of compression cores to process the compression operations.

25. A computer program product for reducing decompression latency in a compression processing storage system using a pool of a plurality of compression cores, the computer program product comprising a non-transitory computer-readable storage medium having computer-readable program code portions stored therein, the computer-readable program code portions comprising:
- a first executable portion that assigns to the plurality of compression cores for processing only one of compression operations, decompression operations, and decompression and compression operations that are scheduled for processing; and
- a second executable portion that allocates a minimal number of compression cores for processing compression operations, thereby increasing a compression latency, wherein upon reaching a throughput limit for the compression operations that causes the minimal number of compression cores to reach a busy status, the minimal number of compression cores for processing the compression operations is increased.

26. The computer program product of claim 25, further including a third executable portion that sets a maximum number of compression cores for processing only decompression operations, thereby lowering the decompression latency.

27. The computer program product of claim 25, further including a fourth executable portion that assigns a thread weight value (TWV) to each one of the plurality of processing cores having a difference in processing power, wherein the one of compression operations, decompression operations, and decompression and compression operations, between the pool of the plurality of processing cores, are proportionally scheduled according to the TWV.

28. The computer program product of claim 25, further including a fourth executable portion that, if processing compression operations, sustains a bandwidth of the compression operations by measuring core idle time and a throughput limit.

29. The computer program product of claim 25, further including a fourth executable portion that sets a time-out period for a predetermined threshold period for processing the one of compression operations, decompression operations, and decompression and compression operations.

30. The computer program product of claim 25, further including a fourth executable portion that, if processing compression and decompression operations, assigns the decompression and compression operations to each of the plurality of processing cores for processing if each of the plurality of compression cores have attained the busy status.

31. The computer program product of claim 25, wherein the busy status represents those of the plurality of compression cores that have processed the one of the compression operations, decompression operations, and decompression and compression operations during a predetermined threshold period.

32. The computer program product of claim 25, further including a fourth executable portion that assigns only decompression operations to the plurality of compression cores having an idle status, wherein the idle status represents those of the plurality of compression cores that have yet to process the one of compression operations, decompression operations, and decompression and compression operations during a predetermined threshold period.

33. The computer program product of claim 31, further including a fifth executable portion that:
- if processing compression operations, determines whether each one of the plurality of compression cores had one of the idle status and the busy status during a last-predetermined threshold period; and
- determines the minimum number of the plurality of compression cores by locating the lastmost positioned one of the plurality of compression cores to process the compression operations.

34. The computer program product of claim 25, further including a fourth executable portion that determines the maximum number of the plurality of compression cores by, from a firstmost positioned one of the plurality of compression cores, sequentially counting each one of the plurality of compression cores, until reaching a lastmost positioned one of the plurality of compression cores, to include in the maximum number of the plurality of compression cores to process decompression operations.

35. The computer program product of claim 33, further including a sixth executable portion that:
- if processing compression operations, if the lastmost positioned one of the plurality of compression cores is determined to be in the busy status, and those of the plurality of compression cores positioned before the lastmost positioned one of the plurality of compression cores are in the idle status:
  - permits one of the plurality of compression cores that is positioned immediately before the lastmost positioned one of the plurality of compression to process the compression operations.

36. The computer program product of claim 35, further including a seventh executable portion that:
- if processing compression operations, if at least one or more of an nth number of lastmost positioned ones of the plurality of compression cores are determined to be in the busy status, and all other of the plurality of compression cores to the left of the at least one or more of the nth number of lastmost positioned ones of the plurality of compression cores are in the idle status:
- permits an additional one of the at least one or more of the nth number of lastmost positioned ones of the plurality of compression cores to process the compression operations.

* * * * *